United States Patent
Kao (10) Patent No.: US 10,631,425 B2
(45) Date of Patent: Apr. 21, 2020

(54) ELECTRICALLY-CONDUCTING PLATE, UNINTERRUPTIBLE SLIDING MECHANISM, AND RELATED SERVER APPARATUS

(71) Applicant: Wistron Corporation, New Taipei (TW)

(72) Inventor: Cheng-Sen Kao, New Taipei (TW)

(73) Assignee: Wiwynn Corporation, New Taipei (TW)

(*) Notice: Subject to any disclaimer, the term of this patent is extended or adjusted under 35 U.S.C. 154(b) by 78 days.

(21) Appl. No.: 15/853,943

(22) Filed: Dec. 25, 2017

(65) Prior Publication Data
US 2019/0110372 A1  Apr. 11, 2019

(30) Foreign Application Priority Data
Oct. 5, 2017  (TW) .............................. 106214766 A (51) Int. Cl.
*H05K 7/14* (2006.01)
*H05K 7/18* (2006.01)
*H05K 5/02* (2006.01)

(52) U.S. Cl.
CPC ......... *H05K 7/1417* (2013.01); *H05K 5/0256* (2013.01); *H05K 7/1491* (2013.01); *H05K 7/1492* (2013.01); *H05K 7/183* (2013.01)

(58) Field of Classification Search
CPC .. H05K 7/1417; H05K 5/0256; H05K 7/1491; H05K 7/183
See application file for complete search history.

(56) References Cited

U.S. PATENT DOCUMENTS

| 8,911,251 | B2 * | 12/2014 | Ehlen | H05K 7/1489 |
|---|---|---|---|---|
| | | | | 439/215 |
| 9,985,403 | B1 * | 5/2018 | Herring | H01R 41/00 |
| 2013/0176728 | A1 * | 7/2013 | Bizzotto | F21V 21/08 |
| | | | | 362/244 |
| 2018/0151995 | A1 * | 5/2018 | Herring | H01R 41/00 |
| 2018/0212390 | A1 * | 7/2018 | Herring | H01R 41/00 |

* cited by examiner

*Primary Examiner* — James Wu
*Assistant Examiner* — Hung Q Dang
(74) *Attorney, Agent, or Firm* — Winston Hsu (57) ABSTRACT

A server apparatus has a server unit disposed inside a casing via an uninterruptible sliding mechanism. The uninterruptible sliding mechanism includes a discharging track disposed on the casing and an electrically-conducting plate disposed on the server unit. The electrically-conducting plate is slidably assembled with the discharging track. The electrically-conducting plate includes a base, a buckling portion and an elastic piece set. The base is electrically connected to the server unit. The buckling portion is disposed on the base to engage with the discharging track. The elastic piece set is disposed on middle of the base and has at least one elastic unit. The elastic unit is an arc structure. An end of the arc structure is fixed to the base, and the other end of the arc structure abuts against the discharging track to continuously transmit energy output from the discharging track to the server unit via the base.

18 Claims, 6 Drawing Sheets

ELECTRICALLY-CONDUCTING PLATE, UNINTERRUPTIBLE SLIDING MECHANISM, AND RELATED SERVER APPARATUS

BACKGROUND OF THE INVENTION

1. Field of the Invention

The present invention relates to a server apparatus capable of keeping an electrically-conducting state in assembly/disassembly process, and more particularly, to a server apparatus capable of utilizing an electrically-conducting plate and an uninterruptible sliding mechanism to keep the electrically-conducting state in assembly/disassembly process.

2. Description of the Prior Art

While a conventional server apparatus is repaired, power supply of a server unit has to be cut off and then the server unit is removed from a rack for replacing electronic components, and the server apparatus cannot be operated during the repair period. For improvement on a drawback of the conventional server apparatus, a flexible cable is set between the server unit and the rack, and two ends of the cable are respectively connected to the server unit and the power supply to accommodate the cable into a gap behind the server unit, so that the cable can be folded and unfolded while the server unit is moved into or out of the rack. However, dimensions of the server unit is designed as being smaller than dimensions of the rack, and the rack can have sufficient inner space to accommodate the cable while the server unit is located inside the rack, which means structural lengths of the rack and the server unit are constrained. Accordingly design of a sliding mechanism capable of keeping the server unit stayed in an electrically-conducting state while being slid relative to the rack is an important issue in the related server industry.

SUMMARY OF THE INVENTION

The present invention provides a server apparatus capable of utilizing an electrically-conducting plate and an uninterruptible sliding mechanism to keep the electrically-conducting state in assembly/disassembly process for solving above drawbacks.

According to the claimed invention, an electrically-conducting plate slidably assembled with a discharging track is disclosed. The electrically-conducting plate includes a base, two buckling portions and an elastic piece set. The two buckling portions are respectively disposed on two opposite sides of the base. The elastic piece set is disposed on the base and located between the two buckling portions; the elastic piece set has at least one elastic unit, and the elastic unit is an arc structure. An end of the arc structure is connected to the base, and the other end of the arc structure abuts against the discharging track, so as to transmit energy output from the discharging track to the base.

According to the claimed invention, an uninterruptible sliding mechanism includes a discharging track and an electrically-conducting plate. The discharging track is electrically connected with an external power supply to acquire energy. The electrically-conducting plate is slidably assembled with the discharging track. The electrically-conducting plate includes a base, two buckling portions and an elastic piece set. The base is adapted to electrically connect with an electronic component. The two buckling portions are respectively disposed on two opposite sides of the base and buckled with the discharging track to suspend the base above the discharging track. The elastic piece set is disposed on the base and located between the two buckling portions; the elastic piece set has at least one elastic unit, and the elastic unit is an arc structure. An end of the arc structure is connected to the base, and the other end of the arc structure abuts against the discharging track. Energy output from the discharging track is transmitted to the electronic component via the base while the electrically-conducting plate is slidably moved relative to the discharging track.

According to the claimed invention, a server apparatus includes a casing, a server unit and an uninterruptible sliding mechanism. The server unit is disposed inside the casing. The server unit is kept in an electrically-conducting state by the uninterruptible sliding mechanism while being slid relative to the casing. The uninterruptible sliding mechanism includes a discharging track and an electrically-conducting plate. The discharging track is disposed on the casing and electrically connected with an external power supply to acquire energy. The electrically-conducting plate is disposed on the server unit and slidably assembled with the discharging track. The electrically-conducting plate a base, two buckling portions and an elastic piece set. The base is adapted to electrically connect with an electronic component of the server unit. The base is adapted to electrically connect with an electronic component of the server unit. The elastic piece set is disposed on the base and located between the two buckling portions; the elastic piece set has at least one elastic unit, and the elastic unit is an arc structure. An end of the arc structure is connected to the base and the other end of the arc structure abuts against the discharging track, and energy output from the discharging track is transmitted to the electronic component via the base while the electrically-conducting plate is slidably moved relative to the discharging track.

The electrically-conducting plate of the present invention disposes the elastic piece set composed of several elastic units on the base; the plural elastic units can be arranged in symmetry or asymmetry, and each elastic unit can be formed as the arc structure via the arc resilient arm portion. Because the elastic unit is designed as the arc structure, each part of the arc resilient arm portion can be deformed accordingly while elastic unit is pressed, which means stress is averagely spread toward the whole parts instead of concentrating upon a few specific parts close to the root portion. Deformation stress applied to the elastic unit can be effectively decreased to be smaller than yield stress, so the elastic unit can maintain the linear resilient property, and resilience of the elastic unit is not affected by impact or assembly error. Further, design of the arc resilient arm portion can be used to increase the whole resilience of the elastic unit, which means compression stroke of the elastic unit can be enlarged to avoid instability resulted from assembly tolerance. Moreover, a force applied to the discharging track from the elastic unit can be made smaller while the elastic unit is resiliently deformed, so that kinetic friction which results in abrasion and scratch due to sliding friction motion can be reduced to provide stable voltage supply. The thickness and cost of a plated coating on the golden finger can be decreased; the arc elastic unit has advantages of the large scale compression stroke and low stress concentration on the root portion, and the arc elastic piece set can provide preferred resilient recovering function in long term usage. While the electrically-conducting plate is moved relative to the discharging track, the arc elastic unit can be continuously slid to abut against the discharging track, and the energy output from the external power supply can be stably transmitted to the circuit board under the server unit through the electrically-conducting plate, so that the server apparatus can acquire the stable energy supply.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
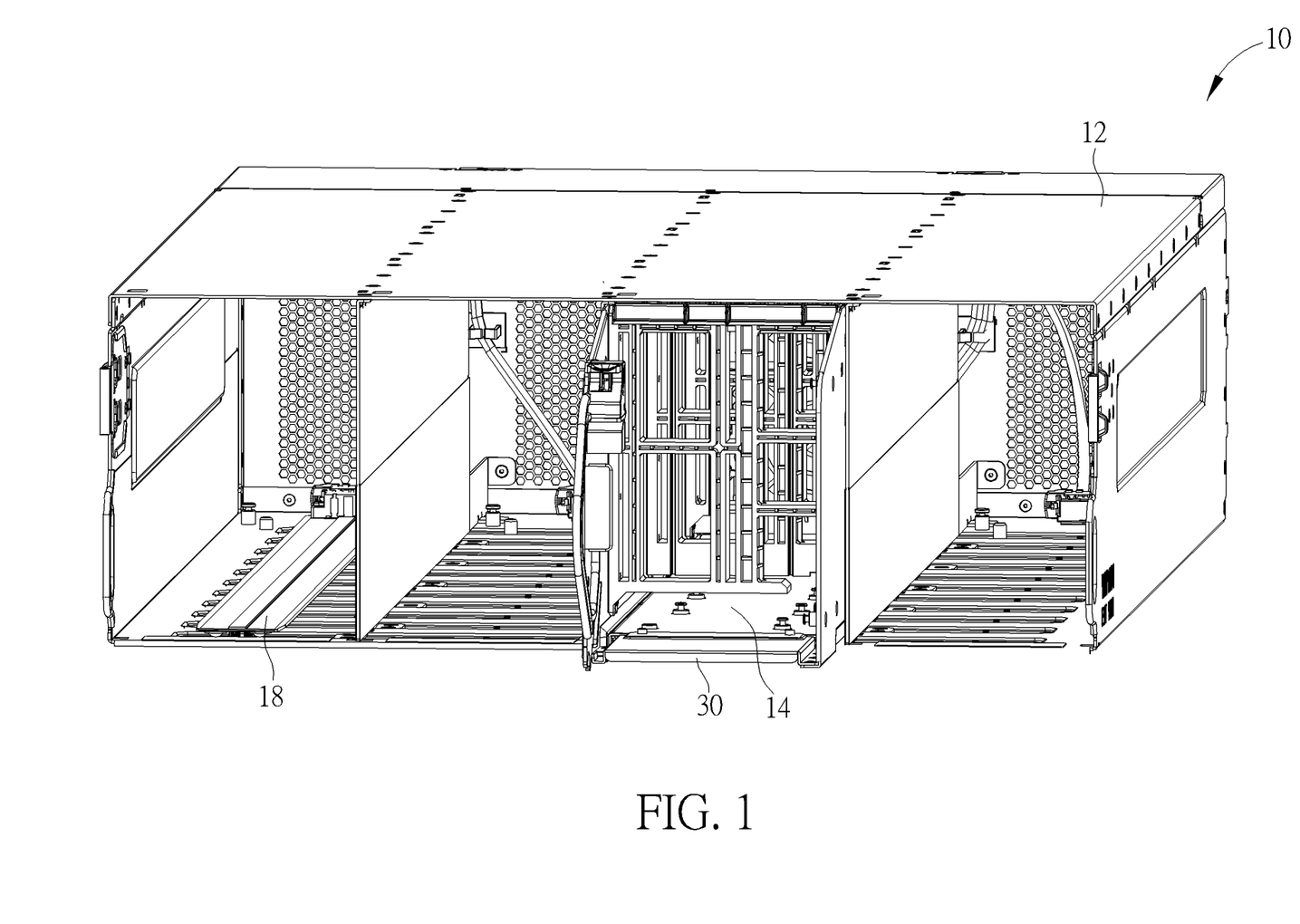
FIG. 1 is an assembly diagram of a server apparatus according to an embodiment of the present invention.
Figure 2:
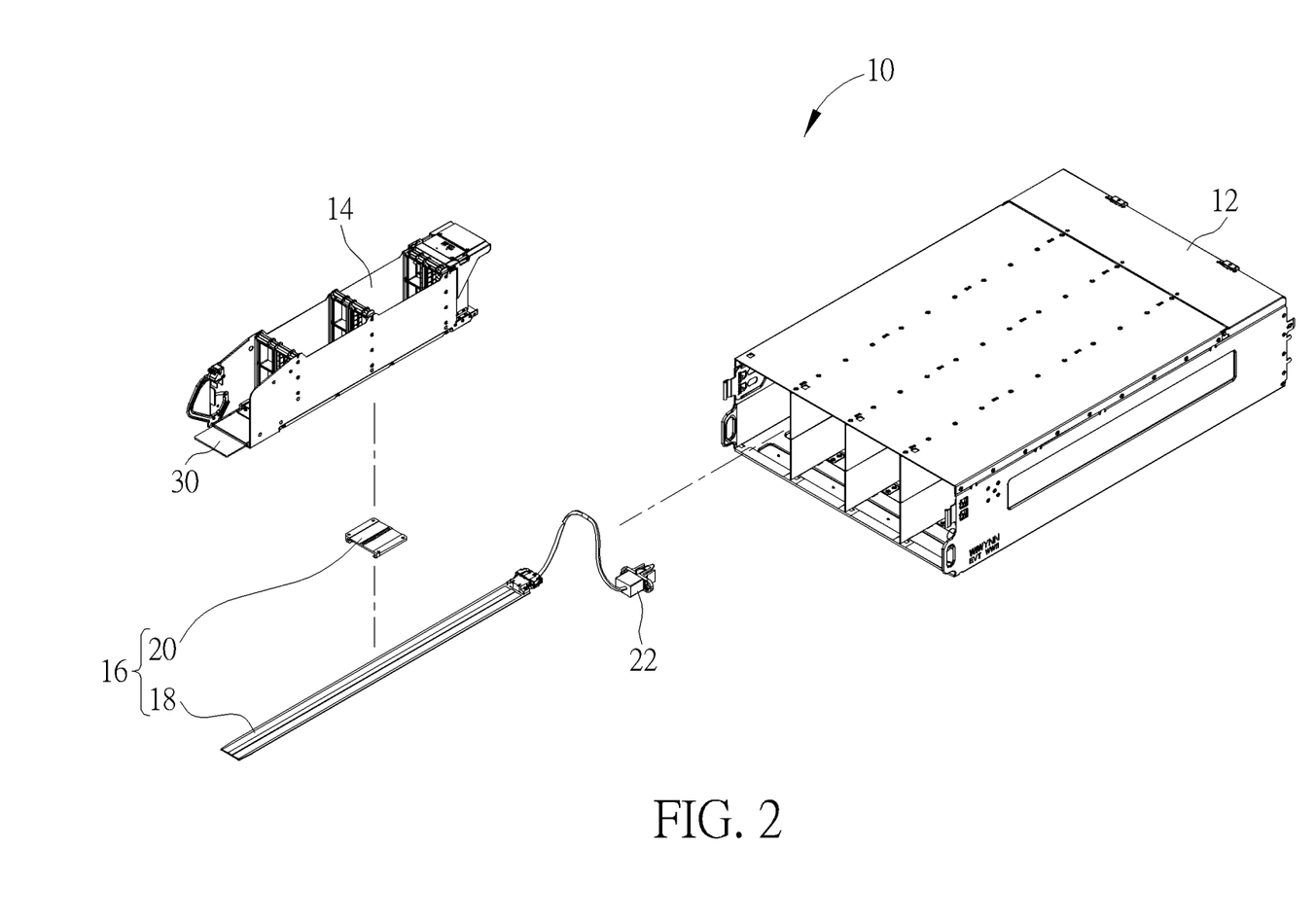
FIG. 2 is an exploded diagram of the server apparatus according to the embodiment of the present invention.

Please refer to FIG. 1 and FIG. 2. FIG. 1 is an assembly diagram of a server apparatus 10 according to an embodiment of the present invention. FIG. 2 is an exploded diagram of the server apparatus 10 according to the embodiment of the present invention. The server apparatus 10 includes a casing 12, a server unit 14 and an uninterruptible sliding mechanism 16. The server unit 14 can be disposed inside the casing 12 via the uninterruptible sliding mechanism 16, and be kept in an electrically-conducting state by the uninterruptible sliding mechanism 16 while the server unit 14 is slidably moved relative to the casing 12. For example, the uninterruptible sliding mechanism 16 has an electrically-conducting plate 20 slidably assembled with a discharging track 18 in a line contacting manner or in a surface contacting manner. The discharging track 18 is disposed inside the casing 12 and electrically connected with an external power supply 22 to acquire energy. The electrically-conducting plate 20 is disposed on a bottom of the server unit 14 and movably assembled with the discharging track 18.

Figure 3:
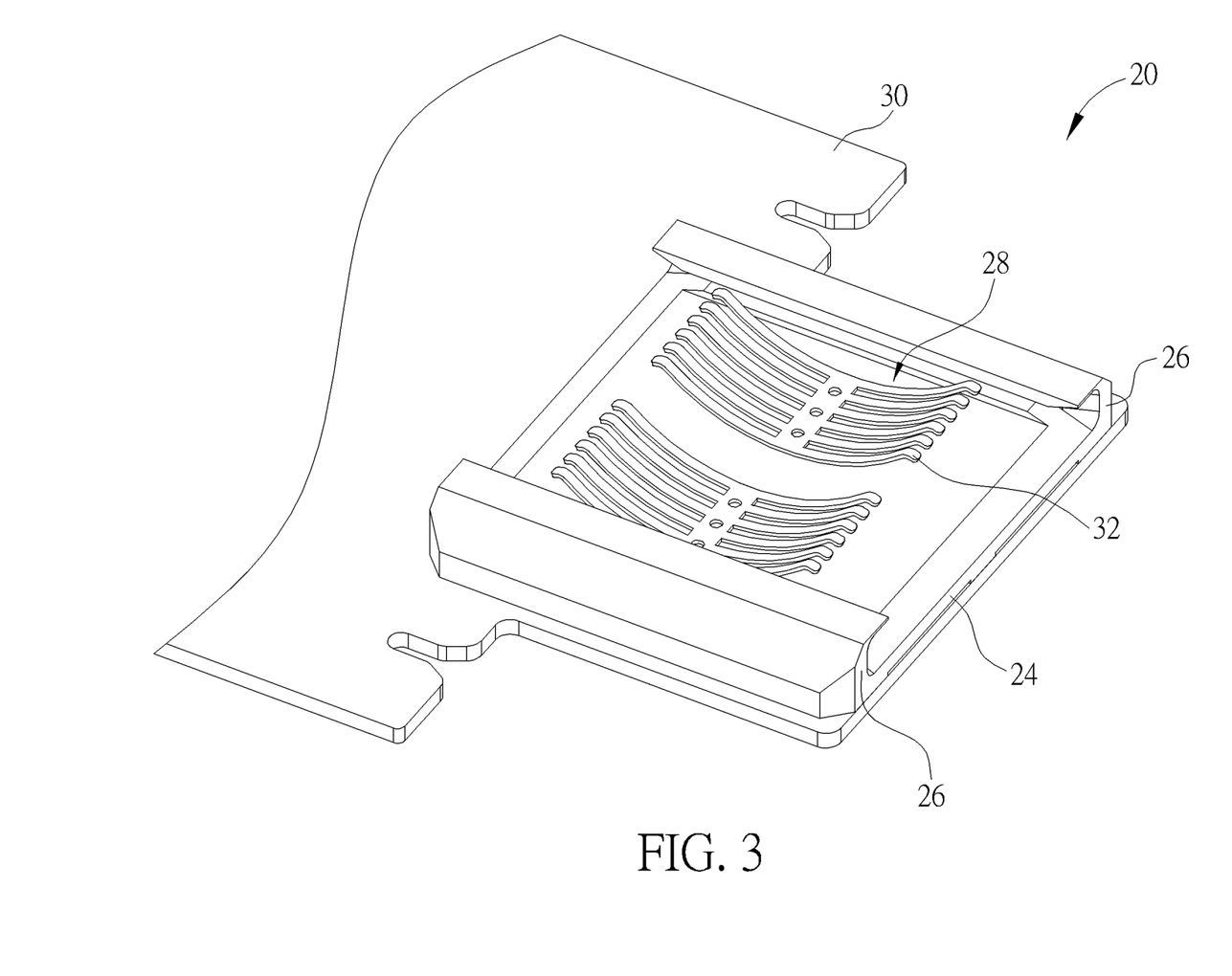
FIG. 3 is a diagram of an electrically-conducting plate according to the embodiment of the present invention.
Figure 4:
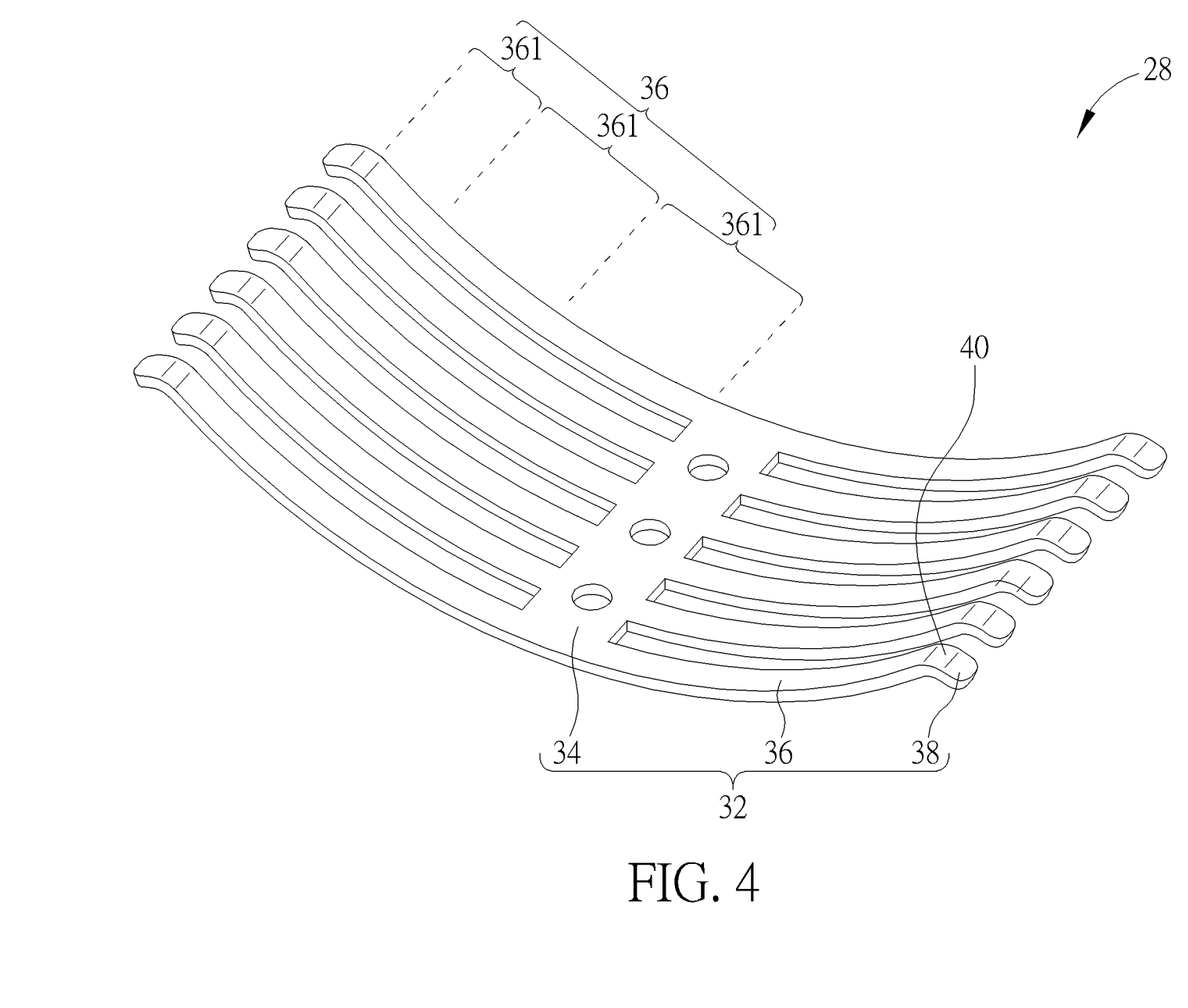
FIG. 4 is an enlarged diagram of the electrically-conducting plate according to the embodiment of the present invention.

Please refer to FIG. 2 to FIG. 4. FIG. 3 is a diagram of the electrically-conducting plate 20 according to the embodiment of the present invention. FIG. 4 is an enlarged diagram of the electrically-conducting plate 20 according to the embodiment of the present invention. The electrically-conducting plate 20 may mainly include a base 24, a buckling portion 26 and an elastic piece set 28. The base 24 is electrically connected with an electronic component 30 disposed under the server unit 14. For instance, the electronic component 30 can be a printed circuit board. An amount of the buckling portion 26 preferably can be a plural number, such as two buckling portions 26 respectively disposed on two opposite sides of the base 24. The buckling portion 26 can be designed as a hook structure for buckling an edge of the discharging track 18. Dimensions of inner space of the buckling portion 26 can be larger than a thickness of the discharging track 18, and the base 24 can be spaced from the discharging track 18 in a non-contacting manner. The elastic piece set 28 is located between the two buckling portions 26 and disposed on a side of the base 24 facing toward the discharging track 18. A fixing end of the elastic piece set 28 is connected to the base 24, and a free end of the elastic piece set 28 abuts against the discharging track 18, which means the base 24 can be suspended above the discharging track 18 by the elastic piece set 28 while the electrically-conducting plate 20 is engaged with the discharging track 18.

As shown in FIG. 3 and FIG. 4, the elastic piece set 28 can include one or more elastic units 32. The elastic unit 32 can be an arc structure; the arc elastic unit 32 may be slightly compressed and deformed while the arc elastic unit 32 abuts against the discharging track 18, and the arc elastic unit 32 can be a support used to suspend the base 24 above the discharging track 18. The elastic unit 32 may include a root portion 34, an arc resilient arm portion 36 and a contacting portion 38. The root portion 34 is fixed onto the base 24. The arc resilient arm portion 36 stretches outwardly from each edge of the root portion 34, and the elastic unit 32 can be formed as the arc structure. The contacting portion 38 is disposed on an end of the arc resilient arm portion 36 opposite to the root portion 34 and utilized to abut against the discharging track 18. Therefore, while the electrically-conducting plate 20 is slid relative to the discharging track 18, the elastic unit 32 can keep the contacting portion 38 continuously abutting the discharging track 18 in accordance with resilient deformation of the arc resilient arm portion 36, and energy output from the discharging track 18 can be transmitted to the electronic component 30 via the electrically-conducting plate 20.

The contacting portion 38 may optionally have a guiding structure 40 disposed on a surface of the contacting portion 38 facing the discharging track 18. While the contacting portion 38 of the elastic unit 32 is moved upon the discharging track 18 in a slidably contacting manner, the guiding structure 40 can be used to decrease friction loss and scratch resulted from slidable contacting motion, and further to increase energy supply stability of the uninterruptible sliding mechanism 16. As shown in FIG. 4, the arc resilient arm portion 36 is an integrated arc structure; it is to say, the arc resilient arm portion 36 can include a plurality of parts 361 connected with each other side by side, and the plurality of parts 361 can be arc parts with similar curvature radius. The arc resilient arm portion 36 is not permanently deformed by stress concentration, and can be utilized to preserve linear resilient property of the elastic unit 32.

Figure 5:
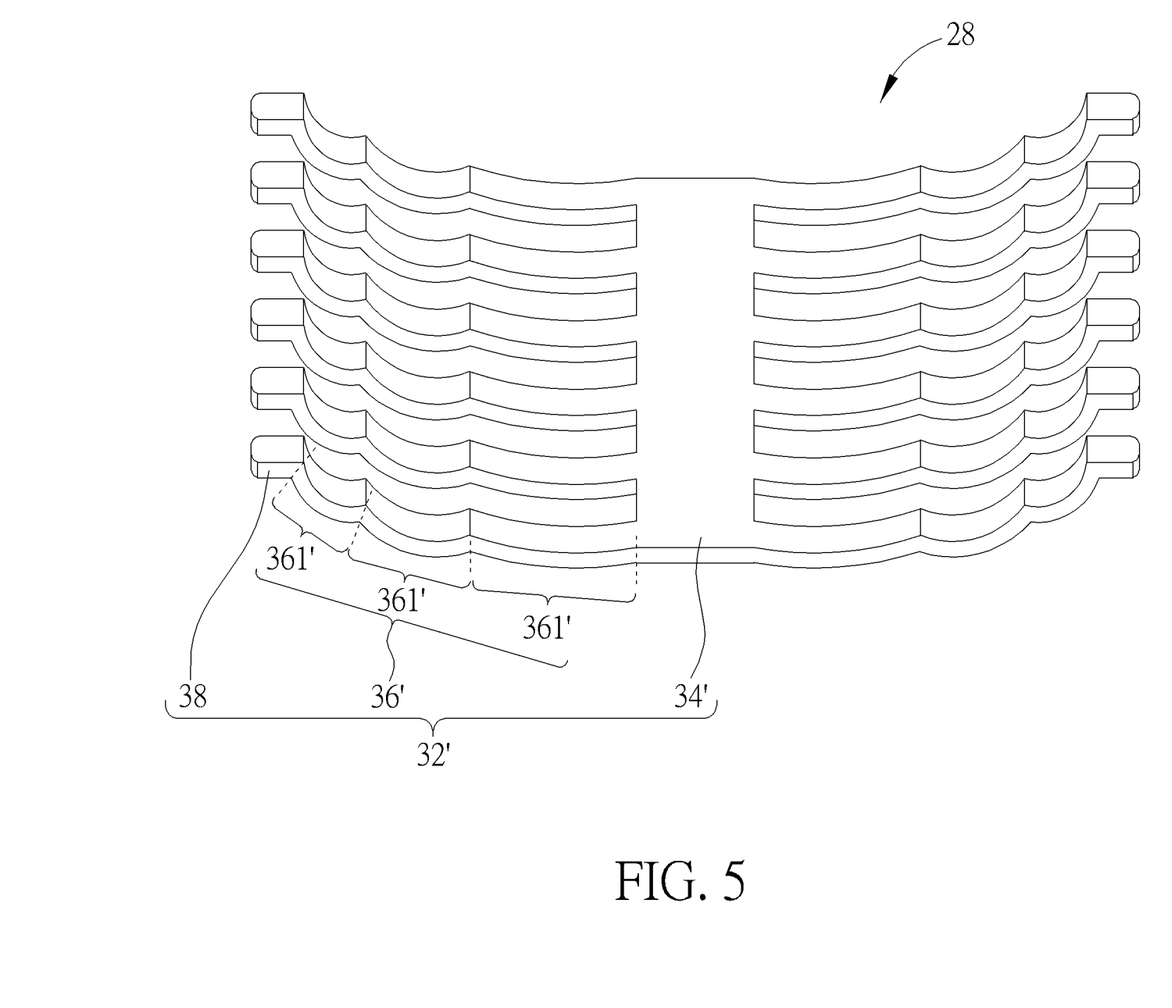
FIG. 5 and FIG. 6 are diagrams of an elastic unit according to different embodiments of the present invention.
Figure 6:
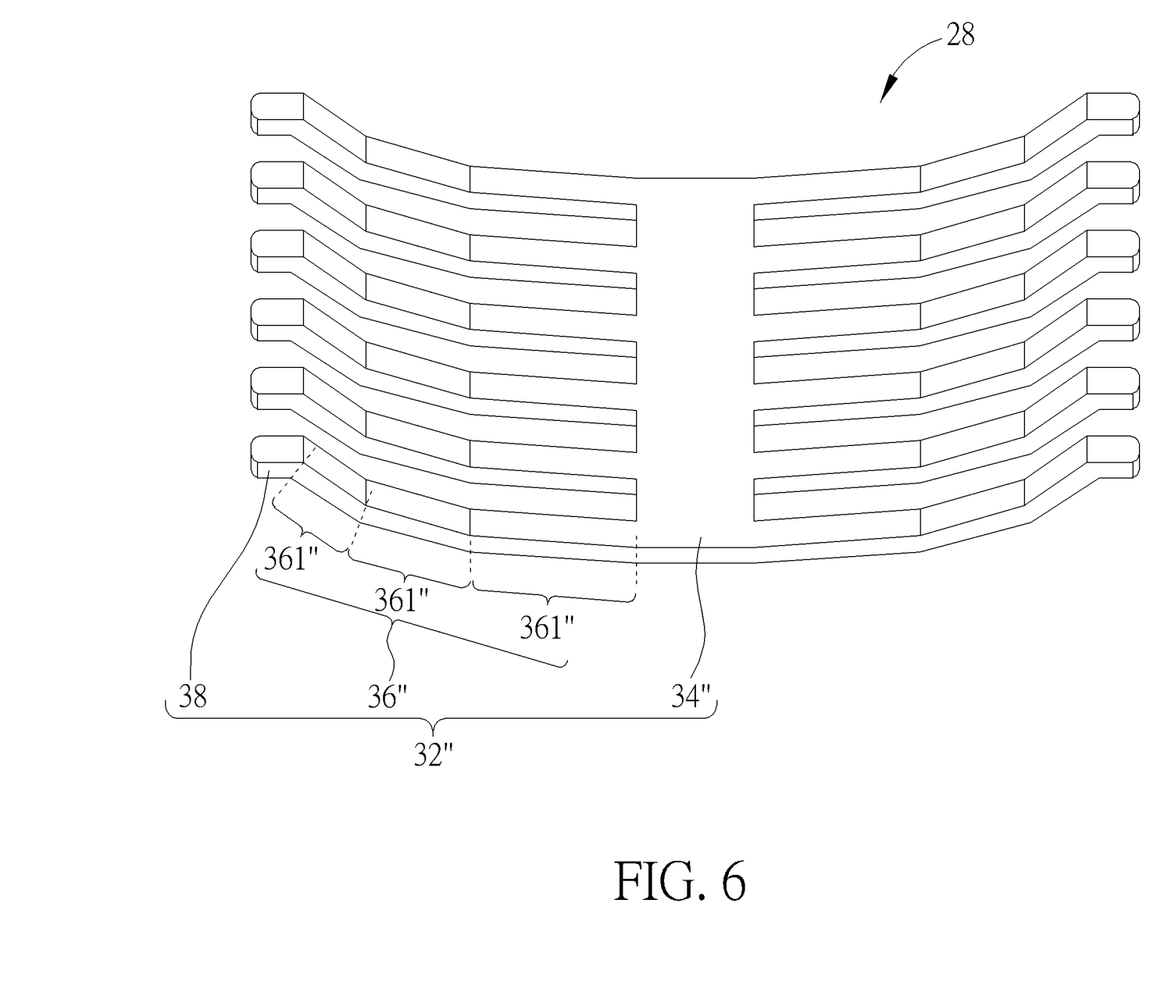

Please refer to FIG. 5 and FIG. 6. FIG. 5 is a diagram of an elastic unit 32' according to the other embodiment of the present invention. FIG. 6 is a diagram of an elastic unit 32" according to the other embodiment of the present invention. In those embodiments, elements having the numerals the same as ones of the above-mentioned embodiment have the same structures and functions, and a detailed description is omitted herein for simplicity. According to the embodiment shown in FIG. 5, the arc resilient arm portion 36' of the elastic unit 32' can have a plurality of arc parts 361' assembled with each other side by side, and curvature radiuses of the arc parts 361' are different from each other. According to the embodiment shown in FIG. 6, the arc resilient arm portion 36" of the elastic unit 32" can have a plurality of non-arc parts 361"; the non-arc part 361" may be designed as a planar part, and the adjacent planar parts 361" are connected with each other in a bending manner, so the elastic unit 32" can be formed as the arc structure. Resilience of the elastic units 32' and 32" can be varied by adjusting the curvature radius of the arc parts 361' and structural length of the non-arc parts 361".

In conclusion, the electrically-conducting plate of the present invention disposes the elastic piece set composed of several elastic units on the base; the plural elastic units can be arranged in symmetry or asymmetry, and each elastic unit can be formed as the arc structure via the arc resilient arm portion. Because the elastic unit is designed as the arc structure, each part of the arc resilient arm portion can be deformed accordingly while elastic unit is pressed, which means stress is averagely spread toward the whole parts instead of concentrating upon a few specific parts close to the root portion. Deformation stress applied to the elastic unit can be effectively decreased to be smaller than yield stress, so the elastic unit can maintain the linear resilient property, and resilience of the elastic unit is not affected by impact or assembly error. Further, design of the arc resilient arm portion can be used to increase the whole resilience of the elastic unit, which means compression stroke of the elastic unit can be enlarged to avoid instability resulted from assembly tolerance. Moreover, a force applied to the discharging track from the elastic unit can be made smaller while the elastic unit is resiliently deformed, so that kinetic friction which results in abrasion and scratch due to sliding friction motion can be reduced to provide stable voltage supply.

The arc resilient arm portion is mainly composed on the plurality of parts connected with each other side by side, and the plurality of parts can be the arc parts with the same curvature radius or with different curvature radiuses, so the plurality of parts further can be the non-arc planar parts, or can be a complex of the arc parts and the non-arc parts (which is not shown in figures). The arc elastic unit has advantages of the large scale compression stroke and low stress concentration on the root portion, and the arc elastic piece set can provide preferred resilient recovering function in long term usage. While the electrically-conducting plate is moved relative to the discharging track, the arc elastic unit can be continuously slid to abut against the discharging track, and the energy output from the external power supply can be stably transmitted to the circuit board under the server unit through the electrically-conducting plate, so that the server apparatus can acquire the stable energy supply. Comparing to the prior art, the electrically-conducting plate and the related uninterruptible sliding mechanism of the present invention can provide stable voltage for the server apparatus, and the thickness and cost of a plated coating on the golden finger can be decreased for preferred market competition.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electrically-conducting plate slidably assembled with a discharging track, the electrically-conducting plate comprising:
    a base;
    two buckling portions respectively disposed on two opposite sides of the base; and
    an elastic piece set disposed on the base and located between the two buckling portions, the elastic piece set having at least one elastic unit, the elastic unit being an arc structure an end of the arc structure being connected to the base, and the other end of the arc structure abutting against the discharging track, so as to transmit energy output from the discharging track to the base, the elastic unit comprising:
        a root portion fixed on the base;
        two arc resilient arm portions respectively stretched from opposite sides of the root portion outwardly; and
        two contacting portions, each contacting portion being connected to one of the arc resilient arm portions opposite to the root portion and utilized to abut against the discharging track.

2. The electrically-conducting plate of claim 1, wherein the contacting portion has a guiding structure disposed on a surface of the contacting portion facing toward the discharging track.

3. The electrically-conducting plate of claim 1, wherein the arc resilient arm portion comprises a plurality of parts connected with each other side by side.

4. The electrically-conducting plate of claim 3, wherein the plurality of parts respectively are arc parts, and curvature radiuses of the plurality of arc parts are the same or different from each other.

5. The electrically-conducting plate of claim 3, wherein the plurality of parts respectively are non-arc parts, and the plurality of non-arc parts are connected with each other in a bending manner.

6. The electrically-conducting plate of claim 3, wherein the plurality of parts comprises the arc parts and non-arc parts connected with each other.

7. An uninterruptible sliding mechanism, comprising:
    a discharging track electrically connected with an external power supply to acquire energy; and
    an electrically-conducting plate slidably assembled with the discharging track, the electrically-conducting plate comprising:
        a base adapted to electrically connect with an electronic component;
        two buckling portions respectively disposed on two opposite sides of the base and buckled with the discharging track to suspend the base above the discharging track; and
        an elastic piece set disposed on the base and located between the two buckling portions, the elastic piece set having at least one elastic unit, the elastic unit being an arc structure an end of the arc structure being connected to the base and the other end of the arc structure abutting against the discharging track, and energy output from the discharging track being transmitted to the electronic component via the base while the electrically-conducting plate is slidably moved relative to the discharging track, the elastic unit comprising:
            a root portion fixed on the base;
            two arc resilient arm portions respectively stretched from opposite sides of the root portion outwardly; and
            two contacting portions, each contacting portion being connected to one of the arc resilient arm portions opposite to the root portion and utilized to abut against the discharging track.

8. The uninterruptible sliding mechanism of claim 7, wherein the contacting portion has a guiding structure disposed on a surface of the contacting portion facing toward the discharging track.

9. The uninterruptible sliding mechanism of claim 7, wherein the arc resilient arm portion comprises a plurality of parts assembled with each other, and the plurality of parts are connected with each other side by side.

10. The uninterruptible sliding mechanism of claim 9, wherein the plurality of parts respectively are e arc parts, and curvature radiuses of the plurality of arc parts are the same or different from each other.

11. The uninterruptible sliding mechanism of claim 9, wherein the plurality of parts respectively are non-arc parts, and the plurality of non-arc parts are connected with each other in a bending manner.

12. The uninterruptible sliding mechanism of claim 9, wherein the plurality of parts comprises arc parts and non-arc parts connected with each other.

13. A server apparatus, comprising:
- a casing;
- a server unit disposed inside the casing; and
- an uninterruptible sliding mechanism, the server unit being kept in an electrically-conducting state by the uninterruptible sliding mechanism while being slid relative to the casing, the uninterruptible sliding mechanism comprising:
  - a discharging track disposed on the casing and electrically connected with an external power supply to acquire energy; and
  - an electrically-conducting plate disposed on the server unit and slidably assembled with the discharging track, the electrically-conducting plate comprising:
    - a base adapted to electrically connect with an electronic component of the server unit;
    - two buckling portions respectively disposed on two opposite sides of the base and buckled with the discharging track to suspend the base above the discharging track; and
    - an elastic piece set disposed on the base and located between the two buckling portions, the elastic piece set having at least one elastic unit, the elastic unit being an arc structure an end of the arc structure being connected to the base and the other end of the arc structure abutting against the discharging track, and energy output from the discharging track being transmitted to the electronic component via the base while the electrically-conducting plate is slidably moved relative to the discharging track, the elastic unit comprising:
      - a root portion fixed on the base;
      - two arc resilient arm portions respectively stretched from opposite sides of the root portion outwardly; and
      - two contacting portions, each contacting portion being connected to one of the arc resilient arm portions opposite to the root portion and utilized to abut against the discharging track.

14. The server apparatus of claim 13, wherein the contacting portion has a guiding structure disposed on a surface of the contacting portion facing toward the discharging track.

15. The server apparatus of claim 13, wherein the arc resilient arm portion comprises a plurality of parts assembled with each other, and the plurality of parts are connected with each other side by side.

16. The server apparatus of claim 15, wherein the plurality of parts respectively are arc parts, and curvature radiuses of the plurality of arc parts are the same or different from each other.

17. The server apparatus of claim 15, wherein the plurality of parts respectively are non-arc parts, and the plurality of non-arc parts are connected with each other in a bending manner.

18. The server apparatus of claim 15, wherein the plurality of parts comprises arc parts and non-arc parts connected with each other.

* * * * *